US012803544B2

(12) United States Patent
Wang et al.

(10) Patent No.: US 12,803,544 B2
(45) Date of Patent: Nov. 17, 2026

(54) HARMONICS CANCELLATION CIRCUIT AND APPARATUS FOR VECTOR SYNTHESIS USING THE SAME

(71) Applicant: ELECTRONICS AND TELECOMMUNICATIONS RESEARCH INSTITUTE, Daejeon (KR)

(72) Inventors: Seung Hun Wang, Daejeon (KR); Sun Woo Kong, Daejeon (KR); Bong Hyuk Park, Daejeon (KR); Hui Dong Lee, Daejeon (KR); Seung Hyun Jang, Daejeon (KR); Jung Hwan Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 18/958,282

(22) Filed: Nov. 25, 2024

(65) Prior Publication Data

US 2025/0219627 A1 Jul. 3, 2025

(30) Foreign Application Priority Data

Dec. 28, 2023 (KR) ........................ 10-2023-0194410

(51) Int. Cl.
*H03K 5/1252* (2006.01)
*H03F 3/19* (2006.01)

(52) U.S. Cl.
CPC ............. *H03K 5/1252* (2013.01); *H03F 3/19* (2013.01)

(58) Field of Classification Search
CPC ................................ H03K 5/1252; H03F 3/19
See application file for complete search history.

(56) References Cited

U.S. PATENT DOCUMENTS

| | | | | |
|---|---|---|---|---|
| 5,712,593 | A * | 1/1998 | Buer | H03G 3/3042 330/132 |
| 7,656,347 | B2 * | 2/2010 | Hong | G01S 7/032 342/21 |
| 8,606,210 | B2 * | 12/2013 | Ru | H03D 7/1458 455/280 |
| 10,644,664 | B2 * | 5/2020 | Chen | H03F 1/26 |
| 10,659,021 | B2 * | 5/2020 | Yeo | H03H 11/18 |
| 10,848,130 | B2 * | 11/2020 | Hong | H03H 11/04 |

(Continued)

FOREIGN PATENT DOCUMENTS

| | | |
|---|---|---|
| CN | 111133631 B | 7/2021 |
| KR | 1020110024319 A | 3/2011 |

(Continued)

*Primary Examiner* — Menatoallah Youssef
*Assistant Examiner* — Khareem E Almo
(74) *Attorney, Agent, or Firm* — Rabin & Berdo, P.C.

(57) ABSTRACT

The present disclosure relates to a harmonics cancellation circuit and a vector synthesis device using a harmonics cancellation circuit. A harmonics cancellation circuit according to an embodiment of the present disclosure includes a plurality of capacitors that one end is connected to a source node of a plurality of amplifiers receiving a plurality of quadrature phase signals, respectively; and a virtual ground to which the other end of each of the plurality of capacitors is commonly connected, wherein the source node of the plurality of amplifiers may be connected to a plurality of current controllers, respectively.

6 Claims, 7 Drawing Sheets

(56) References Cited

U.S. PATENT DOCUMENTS

| | | | | |
|---|---|---|---|---|
| 11,277,118 | B2 | 3/2022 | Hong et al. | |
| 11,563,407 | B2 * | 1/2023 | Li | H03D 7/1475 |
| 2005/0140402 | A1 * | 6/2005 | Sung | H03D 7/1408 327/113 |
| 2008/0132194 | A1 | 6/2008 | Ji et al. | |
| 2017/0141763 | A1 | 5/2017 | Moon et al. | |
| 2024/0213940 | A1 * | 6/2024 | Manetakis | H03D 7/1491 |
| 2024/0235489 | A1 * | 7/2024 | Honda | H03F 1/565 |
| 2025/0211175 | A1 * | 6/2025 | Xue | H03F 3/45475 |

FOREIGN PATENT DOCUMENTS

| | | | |
|---|---|---|---|
| KR | 10-1865612 | B1 | 6/2018 |
| KR | 10-2019-0086897 | A | 7/2019 |

* cited by examiner

HARMONICS CANCELLATION CIRCUIT AND APPARATUS FOR VECTOR SYNTHESIS USING THE SAME

CROSS-REFERENCE TO RELATED APPLICATIONS

This application claims the benefit of earlier filing date and right of priority to Korean Application No. 10-2023-0194410, filed on Dec. 28, 2023, the contents of which are all hereby incorporated by reference herein in their entirety.

TECHNICAL FIELD

The present disclosure relates to vector synthesis, and more particularly, to a harmonics cancellation circuit and a vector synthesis device using a harmonics cancellation circuit.

BACKGROUND ART

A vector synthesis-based phase shifter may include an I/Q generator that converts an input signal into an orthogonal phase signal (e.g., a quadrature phase signal) with a 90-degree phase difference, and a vector synthesizer that synthesizes a vector.

Due to the nonlinearity of field effect transistors (FET) included in a conventional vector synthesizer, harmonics may be generated, and due to a harmonic signal, the gain may be reduced. In addition, there is a problem that the nonlinearity of a circuit increases due to the leakage of harmonic components of a local oscillator in a mixer operation that applies a LO signal.

SUMMARY

The present disclosure is to provide a harmonics cancellation circuit and a vector synthesis device using a harmonics cancellation circuit.

The present disclosure is to provide a harmonics cancellation circuit that improves linearity and power gain by canceling out the harmonic components of a circuit and a device including the same.

The technical objects to be achieved by the present disclosure are not limited to the above-described technical objects, and other technical objects which are not described herein will be clearly understood by those skilled in the pertinent art from the following description.

A harmonics cancellation circuit according to an embodiment of the present disclosure may include a plurality of capacitors that one end is connected to a source node of a plurality of amplifiers receiving a plurality of quadrature phase signals, respectively; and a virtual ground to which the other end of each of the plurality of capacitors is commonly connected. The source node of the plurality of amplifiers may be connected to a plurality of current controllers, respectively.

A differential vector synthesizer according to an additional embodiment of the present disclosure may include a plurality of amplifiers that amplify a plurality of quadrature phase signals, respectively; a plurality of current controllers that control the tail current of a source node of the plurality of amplifiers, respectively; a plurality of capacitors that one end is connected to the source node of the plurality of amplifiers, respectively; and a virtual ground to which the other end of each of the plurality of capacitors is commonly connected.

A radio frequency integrated circuit according to an additional embodiment of the present disclosure may include a quadrature phase signal generator that outputs a plurality of quadrature phase signals corresponding to a differential input signal; a plurality of amplifiers that amplify the plurality of quadrature phase signals, respectively; a plurality of current controllers that control the tail current of a source node of the plurality of amplifiers, respectively; a synthesizer that synthesizes a plurality of amplified quadrature phase signals to output an output signal; and at least one digital to analog converter (DAC) that controls the phase and gain of the output signal. One end of a plurality of capacitors may be connected to the source node of the plurality of amplifiers, respectively and the other end of each of the plurality of capacitors may be commonly connected to a virtual ground.

In some embodiments of the present disclosure, a first amplifier among the plurality of amplifiers may include a first transistor and a second transistor that amplify a first quadrature phase signal (I+) among the plurality of quadrature phase signals.

In some embodiments of the present disclosure, the source node of the first amplifier may be connected to the source node of the first transistor, the source node of the second transistor and the drain of a first current controller among the plurality of current controllers.

In some embodiments of the present disclosure, the first current controller may control the tail current of a source node of the first amplifier.

In some embodiments of the present disclosure, one end of a first capacitor among the plurality of capacitors may be connected to the source node of the first amplifier, and the other end of the first capacitor may be connected to the virtual ground.

In some embodiments of the present disclosure, a second amplifier among the plurality of amplifiers may include a third transistor and a fourth transistor that amplify a second quadrature phase signal (I−) among the plurality of quadrature phase signals.

In some embodiments of the present disclosure, the source node of the second amplifier may be connected to the source node of the third transistor, the source node of the fourth transistor and the drain of a second current controller among the plurality of current controllers.

In some embodiments of the present disclosure, the second current controller may control the tail current of a source node of the second amplifier.

In some embodiments of the present disclosure, one end of a second capacitor among the plurality of capacitors may be connected to the source node of the second amplifier and the other end of the second capacitor may be connected to the virtual ground.

In some embodiments of the present disclosure, a third amplifier among the plurality of amplifiers may include a fifth transistor and a sixth transistor that amplify a third quadrature phase signal (Q+) among the plurality of quadrature phase signals.

In some embodiments of the present disclosure, the source nodes of the third amplifier may be connected to the source node of the fifth transistor, the source node of the sixth transistor and the drain of a third current controller among the plurality of current controllers.

In some embodiments of the present disclosure, the third current controller may control the tail current of a source node of the third amplifier.

In some embodiments of the present disclosure, one end of a third capacitor among the plurality of capacitors may be connected to the source node of the third amplifier and the other end of the third capacitor may be connected to the virtual ground.

In some embodiments of the present disclosure, a fourth amplifier among the plurality of amplifiers may include a seventh transistor and an eighth transistor that amplify a fourth quadrature phase signal (Q−) among the plurality of quadrature phase signals.

In some embodiments of the present disclosure, the source node of the fourth amplifier may be connected to the source node of the seventh transistor, the source node of the eighth transistor and the drain of a fourth current controller among the plurality of current controllers.

In some embodiments of the present disclosure, the fourth current controller may control the tail current of a source node of the fourth amplifier.

In some embodiments of the present disclosure, one end of a fourth capacitor among the plurality of capacitors may be connected to the source node of the fourth amplifier and the other end of the fourth capacitor may be connected to the virtual ground.

In some embodiments of the present disclosure, the at least one DAC may include at least one of a gain control DAC, a first phase control DAC or a second phase control DAC.

The features briefly summarized above with respect to the present disclosure are just an exemplary aspect of a detailed description of the present disclosure described below, and do not limit a scope of the present disclosure.

According to the present disclosure, a harmonics cancellation circuit and a vector synthesis device using a harmonics cancellation circuit may be provided.

According to the present disclosure, a harmonics cancellation circuit that improves linearity and power gain by canceling out the harmonic components of a circuit and a device using a harmonics cancellation circuit may be provided.

Effects achievable by the present disclosure are not limited to the above-described effects, and other effects which are not described herein may be clearly understood by those skilled in the pertinent art from the following description.

DETAILED DESCRIPTION

Figure 1:
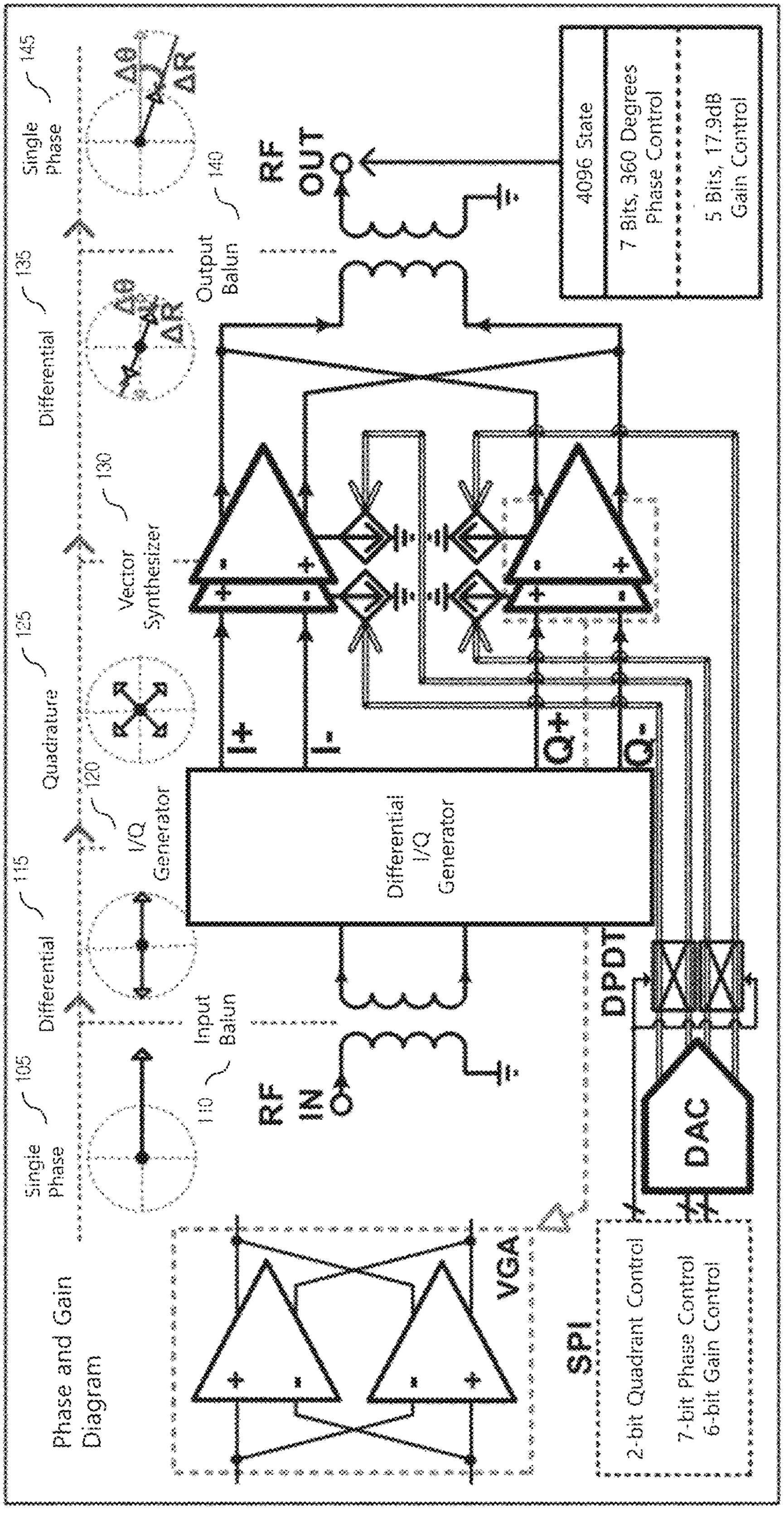
FIG. 1 is a diagram showing the entire structure of an active type phase shifter based on vector synthesis to which the present disclosure may be applied.

As the present disclosure may make various changes and have multiple embodiments, specific embodiments are illustrated in a drawing and are described in detail in a detailed description. But, it is not to limit the present disclosure to a specific embodiment, and should be understood as including all changes, equivalents and substitutes included in an idea and a technical scope of the present disclosure. A similar reference numeral in a drawing refers to a like or similar function across multiple aspects. A shape and a size, etc. of elements in a drawing may be exaggerated for a clearer description. A detailed description on exemplary embodiments described below refers to an accompanying drawing which shows a specific embodiment as an example. These embodiments are described in detail so that those skilled in the pertinent art can implement an embodiment. It should be understood that a variety of embodiments are different each other, but they do not need to be mutually exclusive. For example, a specific shape, structure and characteristic described herein may be implemented in other embodiment without departing from a scope and a spirit of the present disclosure in connection with an embodiment. In addition, it should be understood that a position or an arrangement of an individual element in each disclosed embodiment may be changed without departing from a scope and a spirit of an embodiment. Accordingly, a detailed description described below is not taken as a limited meaning and a scope of exemplary embodiments, if properly described, are limited only by an accompanying claim along with any scope equivalent to that claimed by those claims.

In the present disclosure, a term such as first, second, etc. may be used to describe a variety of elements, but the elements should not be limited by the terms. The terms are used only to distinguish one element from other element. For example, without getting out of a scope of a right of the present disclosure, a first element may be referred to as a second element and likewise, a second element may be also referred to as a first element. A term of "and/or" includes a combination of a plurality of relevant described items or any item of a plurality of relevant described items.

When an element in the present disclosure is referred to as being "connected" or "linked" to another element, it should be understood that it may be directly connected or linked to that another element, but there may be another element between them. Meanwhile, when an element is referred to as being "directly connected" or "directly linked" to another element, it should be understood that there is no another element between them.

As construction units shown in an embodiment of the present disclosure are independently shown to represent different characteristic functions, it does not mean that each construction unit is composed in a construction unit of separate hardware or one software. In other words, as each construction unit is included by being enumerated as each construction unit for convenience of a description, at least two construction units of each construction unit may be combined to form one construction unit or one construction unit may be divided into a plurality of construction units to perform a function, and an integrated embodiment and a separate embodiment of each construction unit are also included in a scope of a right of the present disclosure unless they are beyond the essence of the present disclosure.

A term used in the present disclosure is just used to describe a specific embodiment, and is not intended to limit the present disclosure. A singular expression, unless the context clearly indicates otherwise, includes a plural expression. In the present disclosure, it should be understood that a term such as "include" or "have", etc. is just intended to designate the presence of a feature, a number, a step, an operation, an element, a part or a combination thereof described in the present specification, and it does not exclude in advance a possibility of presence or addition of one or more other features, numbers, steps, operations, elements, parts or their combinations. In other words, a description of "including" a specific configuration in the present disclosure does not exclude a configuration other than a corresponding configuration, and it means that an additional configuration may be included in a scope of a technical idea of the present disclosure or an embodiment of the present disclosure.

Some elements of the present disclosure are not a necessary element which performs an essential function in the present disclosure and may be an optional element for just improving performance. The present disclosure may be implemented by including only a construction unit which is necessary to implement essence of the present disclosure except for an element used just for performance improvement, and a structure including only a necessary element except for an optional element used just for performance improvement is also included in a scope of a right of the present disclosure.

Hereinafter, an embodiment of the present disclosure is described in detail by referring to a drawing. In describing an embodiment of the present specification, when it is determined that a detailed description on a relevant disclosed configuration or function may obscure a gist of the present specification, such a detailed description is omitted, and the same reference numeral is used for the same element in a drawing and an overlapping description on the same element is omitted.

The present disclosure describes a differential vector synthesizer that has harmonics cancellation characteristics among the radio frequency integrated circuits for a high-frequency system. For example, a quadrature phase signal input to a differential vector synthesizer may include four signals having a 90-degree phase difference. For example, four quadrature phase signals may be indicated as I+, I−, Q+ and Q−. A vector synthesizer may control and synthesize the size of an input quadrature phase signal to adjust the phase size of an output vector. In particular, the present disclosure describes a new circuit structure that reduces harmonics components generated in the synthesis of quadrature phase signals within a circuit. In short, a virtual ground where harmonics components are generated may be tied to a large capacitor to make an AC short, cancelling out harmonics components each other.

FIG. 1 is a diagram showing the entire structure of an active type phase shifter based on vector synthesis to which the present disclosure may be applied.

A phase shifter may include an input balanced-to-unbalanced (BALUN) (110), a quadrature signal generator (I/Q generator) (120), a vector synthesizer (130) and an output BALUN (140).

An input balun (110) may convert an input single phase signal (105) into a differential input signal (115) for driving a quadrature signal generator (120). A differential input signal (115) may include the first differential input signal having the same phase as an input single phase signal (105) and the second differential input signal having a 180-degree phase difference from an input single phase signal (105). An input balun (110) may also be included in a transmission line transformer (TLT).

A quadrature signal generator (120) may output a quadrature signal (125) corresponding to a differential input signal (115). A quadrature signal corresponds to a quadrature phase signal that the phases of signals are orthogonal to each other. A quadrature signal may also be referred to as an I/Q signal, wherein I may refer to an in-phase and Q may refer to a quadrature-phase. Four signals having a 90-degree phase difference may be indicated as I+, I−, Q+ and Q−. For example, a quadrature signal generator (120) may include a differential I/Q generator.

A vector synthesizer (130) may receive a quadrature signal (125) to amplify each quadrature signal (i.e., I+, I−, Q+, and Q−) and synthesize amplified quadrature signals to output a differential output signal (135). The gain value of amplification for each quadrature signal (i.e., I+, I−, Q+, and Q−) may be controlled differently. For example, the gain value of an amplifier applied to each quadrature signal may be appropriately and independently controlled so that an output signal (i.e., a signal that quadrature signals are combined) has a desired phase. For example, an amplifier may include Variable Gain Amplifiers (VGA). A phase control bit and a gain control bit may be input to a Double Pole Double Throw (DPDT) switch having two inputs and four outputs through a Serial Peripheral Interface (SPI) and a digital to analog converter (DAC). A quadrant control bit may be input to a DPDT switch. Accordingly, proper amplification may be applied to each quadrature signal. For example, a vector synthesizer (130) may generate a differential output signal (135) by adjusting and synthesizing the size of each of the four vectors based on four current control signals and four quadrature signals (i.e., I+, I−, Q+, and Q−) from a DAC/a DPDT. The more detailed structure and operation of a vector synthesizer (130) are described later.

An output balun (140) may receive a differential output signal (135) to output a single phase output signal (145). In other words, a single phase output signal (145) whose phase and gain are modulated compared to a single phase input signal (105) may be obtained. A differential output signal (135) may include the first differential output signal having the same phase as an output single phase signal (145) and the second differential input signal having a 180-degree phase difference from an output single phase signal (145). An output balun (140) may be included in a transmission line transformer (TLT).

Figure 2:
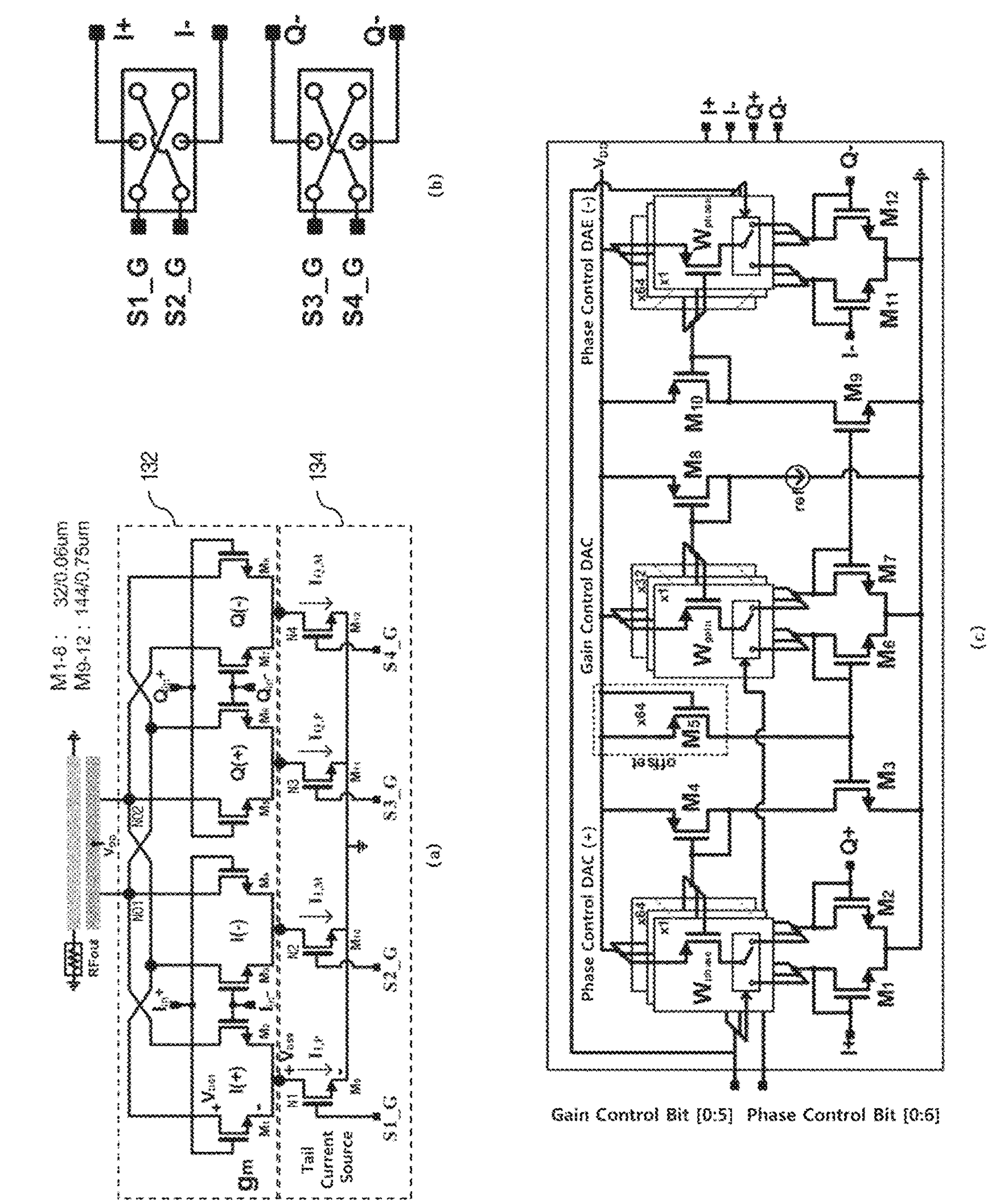
FIG. 2 is a diagram for describing an example of a vector synthesizer to which the present disclosure may be applied.

FIG. 2 is a diagram for describing an example of a vector synthesizer to which the present disclosure may be applied.

FIG. 2(*a*) shows the detailed structure of a vector synthesizer (130) in FIG. 1. A vector synthesizer (130) may include an amplification and synthesis circuit (132) and a current control circuit (134). An amplification and synthesis circuit (132) may include four amplifiers (i.e., parts corresponding to four quadrature signals I+, I−, Q+ and Q−). A current control circuit (134) may include four current controllers (i.e., parts corresponding to four current control signals S1_G, S2_G, S3_G, S4_G).

A first current controller may adjust the size of the first current ($I_{I,P}$) corresponding to the first vector based on one of the first current control signal (S1_G) and the second current control signal (S2_G) (see FIG. 2(*b*)). The second current controller may adjust the size of the first current ($I_{I,M}$) corresponding to the second vector based on the other of the first current control signal (S1_G) and the second current control signal (S2_G) (see FIG. 2(*b*)). Although an example in FIG. 2 shows a case in which the first current controller operates in response to the first current control signal (S1_G) and the second current controller operates in response to the second current control signal (S2_G), a case in which the first current controller operates in response to the second current control signal (S2_G) and the second current controller operates in response to the first current control signal (S1_G) is also included in the scope of the present disclosure.

The third current controller may adjust the size of the first current ($I_{Q,P}$) corresponding to the third vector based on one of the third current control signal (S3_G) and the fourth current control signal (S4_G) (see FIG. 2(*b*)). The fourth current controller may adjust the size of the fourth current ($I_{Q,M}$) corresponding to the fourth vector based on the other of the third current control signal (S3_G) and the fourth current control signal (S4_G) (see FIG. 2(*b*)). Although an example in FIG. 2 shows a case in which the third current controller operates in response to the third current control signal (S3_G) and the fourth current controller operates in response to the fourth current control signal (S4_G), a case in which the third current controller operates in response to the fourth current control signal (S4_G) and the fourth current controller operates in response to the third current control signal (S3_G) is also included in the scope of the present disclosure.

The first to fourth current controllers may be configured by including one transistor, respectively. For example, the first current controller may include the first current control transistor ($M_9$) that is connected between the first source node (N1) of the first amplifier and a ground node (e.g., VSS or GND voltage) and has a gate electrode receiving one of the first and second current control signals (S1_G, S2_G). The second current controller may include the second current control transistor ($M_{10}$) that is connected between the second source node (N2) of the second amplifier and a ground node and has a gate electrode receiving the other of the first and second current control signals (S1_G, S2_G). The third current controller may include the third current control transistor ($M_{11}$) that is connected between the third source node (N3) of the third amplifier and a ground node and has a gate electrode receiving one of the third and fourth current control signals (S3_G, S4_G). The fourth current controller may include the fourth current control transistor ($M_{12}$) that is connected between the fourth source node (N4) of the fourth amplifier and a ground node and has a gate electrode receiving the other of the third and fourth current control signals (S3_G, S4_G).

An amplification and synthesis circuit (132) is connected to all of the first to fourth current controllers, receives the first to fourth quadrature signals (i.e., $I_{in}+$, $I_{in}-$, $Q_{in}+$, and $Q_{in}-$) and may generate two differential output signals based on the first to fourth currents (i.e., $I_{I,P}$, $I_{I,M}$, $I_{Q,P}$, $I_{Q,M}$).

The first amplifier (I+) may include the first transistor ($M_1$) and the second transistor ($M_2$). The first transistor ($M_1$) may be connected between the first output node (NO1) and the first source node (N1) and may have a gate that receives the first quadrature signal ($I_{in}+$). The second transistor ($M_2$) may be connected between the second output node (NO2) and the first source node (N1) and may have a gate that receives the second quadrature signal ($I_{in}-$).

The second amplifier (I−) may include the third transistor ($M_3$) and the fourth transistor ($M_4$). The third transistor ($M_3$) may be connected between the first output node (NO1) and the second source node (N2) and may have a gate that receives the second quadrature signal ($I_{in}-$). The fourth transistor ($M_4$) may be connected between the second output node (NO2) and the second source node (N2) and may have a gate that receives the first quadrature signal ($I_{in}+$).

The third amplifier (Q+) may include the fifth transistor ($M_5$) and the sixth transistor ($M_6$). The fifth transistor ($M_5$) may be connected between the first output node (NO1) and the third source node (N3) and may have a gate that receives the third quadrature signal ($Q_{in}+$). The sixth transistor ($M_6$) may be connected between the second output node (NO2) and the third source node (N3) and may have a gate that receives the fourth quadrature signal ($Q_{in}-$).

The fourth amplifier (Q−) may include the seventh transistor ($M_7$) and the eighth transistor ($M_8$). The seventh transistor ($M_7$) may be connected between the first output node (NO1) and the fourth source node (N4) and may have a gate that receives the fourth quadrature signal ($Q_{in}-$). The eighth transistor ($M_8$) may be connected between the second output node (NO2) and the fourth source node (N4) and may have a gate that receives the third quadrature signal ($Q_{in}+$).

The first and second output nodes (NO1, NO2) may output the first and second differential output signals and may be connected to an output balun (140). Power supply voltage ($V_{DD}$) may be applied to an output balun (140).

In the example of FIG. 2, all of the transistors included in a vector synthesizer (130) are shown as MOSFET, but the type and number of transistors may be changed.

FIG. 2(*c*) shows an example of a circuit including a DAC and a vector synthesizer. In FIG. 2(*c*), transistors ($M_1$ to $M_{12}$) correspond to transistors ($M_1$ to $M_{12}$) in the example of FIG. 2(*a*). Based on a gain control bit and a phase control bit, a current control signal (S1_G, S2_G, S3_G, S4_G) may be output through a phase control DAC and a gain control DAC. A current control signal (S1_G, S2_G, S3_G, S4_G) may be input to the first to fourth current controllers of a vector synthesizer.

According to a vector synthesizer (130) as in FIG. 2, all of the first and second vectors of an in-phase component and the third and fourth vectors of a quadrature-phase component may be used to adjust the size of each vector through a current control signal (S1_G, S2_G, S3_G, S4_G) and synthesize resized vectors to generate an output signal. Accordingly, the phase and gain of an output signal may be controlled independently and efficiently at once. It may be implemented through a current control circuit (134) including one amplification and synthesis circuit (132) and four current controllers connected thereto, and accordingly, a separate selection circuit for vector selection may be omitted, reducing the size and cost of a phase shifter.

A structure including a vector synthesizer as in the example of FIG. 2 may be referred to as a Gilbert cell structure, and a vector synthesizer may operate as a phase shifter (or a phase shifter) or a vector modulator. A vector synthesizer configured with a differential structure may receive four quadrature signals of I+, I−, Q+, Q−, adjust the tail current as described in FIG. 2 (or adjust the ratio of the tail current), adjust the gain of each amplifier, adjust the size of each differential signal corresponding to four phases and combine them at an output terminal, adjusting the phase and gain of an output signal.

Figure 3:
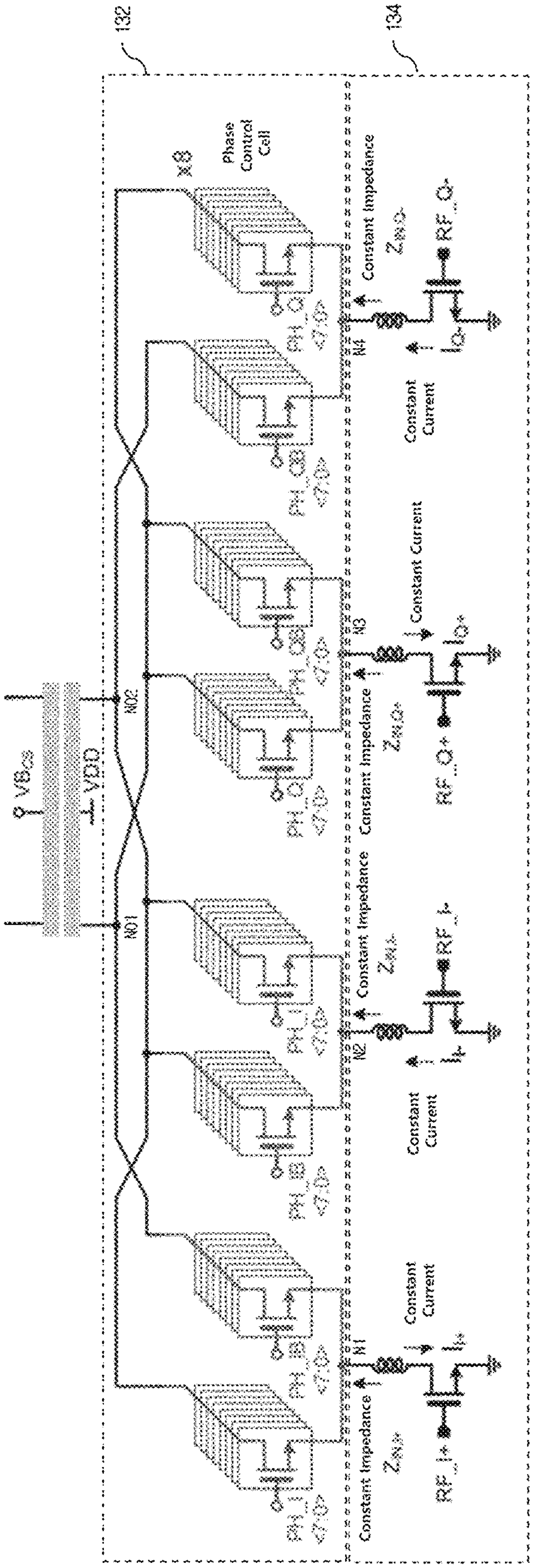
FIG. 3 is a diagram for describing another example of a vector synthesizer to which the present disclosure may be applied.

FIG. 3 is a diagram for describing another example of a vector synthesizer to which the present disclosure may be applied.

An example in FIG. 3 shows the detailed structure of a vector synthesizer (130) in FIG. 1. A vector synthesizer (130) may include an amplification and synthesis circuit (132) and a current control circuit (134). In the example of FIG. 3, the first to fourth source nodes (N1, N2, N3, N4) and the first and second output nodes (NO1, NO2) are the same as those described in FIG. 2.

In the example of FIG. 3, each of the four amplifiers is implemented as a set of cells including multiple (e.g., eight) separated cells like a digital amplifier, and a vector size may be adjusted by turning each cell on and off. In order to keep the output terminal impedance of a vector synthesizer constant, the total current consumed by all amplifiers may be kept constant. The size of a corresponding quadrature signal may be adjusted by adjusting the number of cells turned on (or the ratio of the number of cells turned on) in the amplifier of each path. Accordingly, the phase and gain of a final output signal may be controlled.

As described above, a harmonics signal may be generated due to the nonlinearity of MOSFET configuring a vector synthesizer, but there is a problem that there is no method to reduce this harmonics signal. The present disclosure describes a new method for improving the linearity of a circuit by canceling out a harmonics signal generated from a vector synthesizer, increasing the gain or applying leakage cancellation to the harmonics component of a local oscillator (LO) when a LO signal is applied to a vector synthesizer to operate as a mixer.

Figure 4:
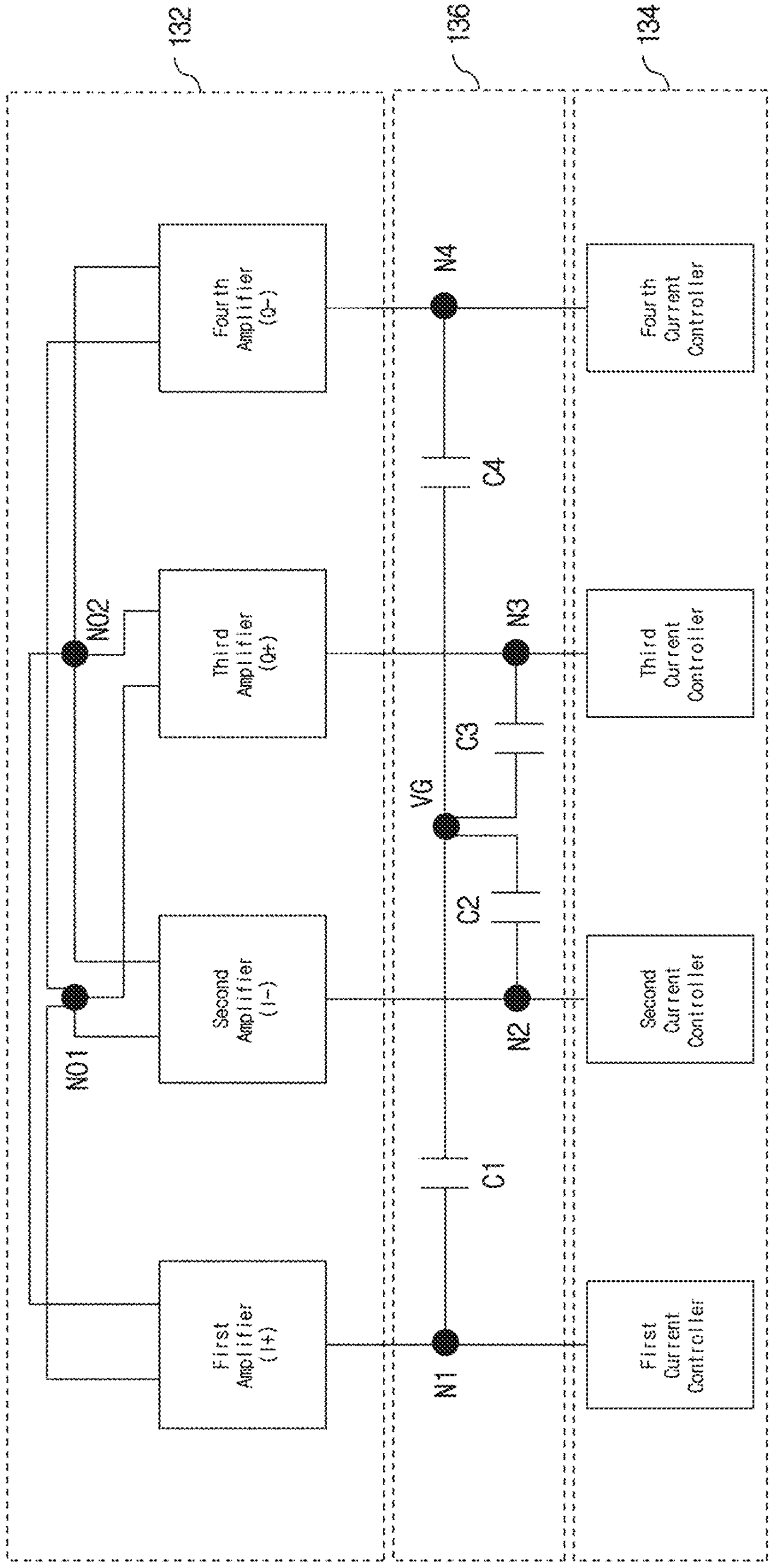
FIG. 4 is a diagram showing an example of a vector synthesizer including a harmonics cancellation circuit according to the present disclosure.

FIG. 4 is a diagram showing an example of a vector synthesizer including a harmonics cancellation circuit according to the present disclosure.

A vector synthesizer (130) in FIG. 4 may include an amplification and synthesis circuit (132), a current control circuit (134) and a harmonics cancellation circuit (136). An amplification and synthesis circuit (132) and a current control circuit (134) may have the same structure as described in the example of FIG. 2 or FIG. 3. In other words, in the example of FIG. 4, it may have a structure in which a harmonics cancellation circuit (136) is added to the structure of a vector synthesizer (130) in FIG. 2 or FIG. 3.

A harmonics cancellation circuit (136) may include a plurality of capacitors (C1, C2, C3, C4). One end of each of a plurality of capacitors may be connected to the source node (N1, N2, N3, N4) of a plurality of amplifiers that receive a plurality of quadrature phase signals (I+, I−, Q+, Q−). The other end of each of a plurality of capacitors may be commonly connected to a virtual ground (VG).

For example, one end of the first capacitor (C1) may be connected to the source node (N1) of the first amplifier and the other end may be connected to a virtual ground (VG). One end of the second capacitor (C2) may be connected to the source node (N2) of the second amplifier and the other end may be connected to a virtual ground (VG). One end of the third capacitor (C3) may be connected to the source node (N3) of the third amplifier and the other end may be connected to a virtual ground (VG). One end of the fourth capacitor (C4) may be connected to the source node (N4) of the fourth amplifier and the other end may be connected to a virtual ground (VG).

As described by referring to FIG. 2 and FIG. 3, an amplification and synthesis circuit (132) may include a plurality of amplifiers. A current control circuit (134) may include a plurality of current controllers. The source node (N1, N2, N3, N4) of a plurality of amplifiers may be connected to a plurality of current controllers, respectively.

For example, the first amplifier may include the first transistor and the second transistor that amplify the first quadrature phase signal (I+). The first transistor may correspond to $M_1$ in FIG. 2 or a phase control cell set PH_I in FIG. 3. The second transistor may correspond to $M_2$ in FIG. 2 or a phase control cell set PH_IB in FIG. 3. The source node (N1) of the first amplifier may be connected to the source node of the first transistor, the source node of the second transistor, the drain of the first current controller and one end of the first capacitor (C1). The first current controller may control the tail current of a source node of the first amplifier.

The second amplifier may include the third transistor and the fourth transistor that amplify the second quadrature phase signal (I−). The third transistor may correspond to $M_3$ in FIG. 2 or a phase control cell set PH_IB in FIG. 3. The fourth transistor may correspond to $M_4$ in FIG. 2 or a phase control cell set PH_I in FIG. 3. The source node (N2) of the second amplifier may be connected to the source node of the third transistor, the source node of the fourth transistor, the drain of the second current controller and one end of the second capacitor (C2). The second current controller may control the tail current of a source node of the second amplifier.

The third amplifier may include the fifth transistor and the sixth transistor that amplify the third quadrature phase signal (Q+). The fifth transistor may correspond to $M_5$ in FIG. 2 or a phase control cell set PH_Q in FIG. 3. The sixth transistor may correspond to $M_6$ in FIG. 2 or a phase control cell set PH_QB in FIG. 3. The source node (N3) of the third amplifier may be connected to the source node of the fifth transistor, the source node of the sixth transistor, the drain of the third current controller and one end of the third capacitor (C3). The third current controller may control the tail current of a source node of the third amplifier.

The fourth amplifier may include the seventh transistor and the eighth transistor that amplify the fourth quadrature phase signal (Q−). The seventh transistor may correspond to $M_7$ in FIG. 2 or a phase control cell set PH_QB in FIG. 3. The eighth transistor may correspond to $M_8$ in FIG. 2 or a phase control cell set PH_Q in FIG. 3. The source node (N4) of the fourth amplifier may be connected to the source node of the seventh transistor, the source node of the eighth transistor, the drain of the fourth current controller and one end of the fourth capacitor (C5). The fourth current controller may control the tail current of a source node of the fourth amplifier.

By a harmonics cancellation circuit (136) as described above, the source nodes of a plurality of amplifiers of a differential vector synthesizer may be gathered into one virtual ground (VG) node through each capacitor. Harmonics may be cancelled through this simple circuit structure.

Figure 5:
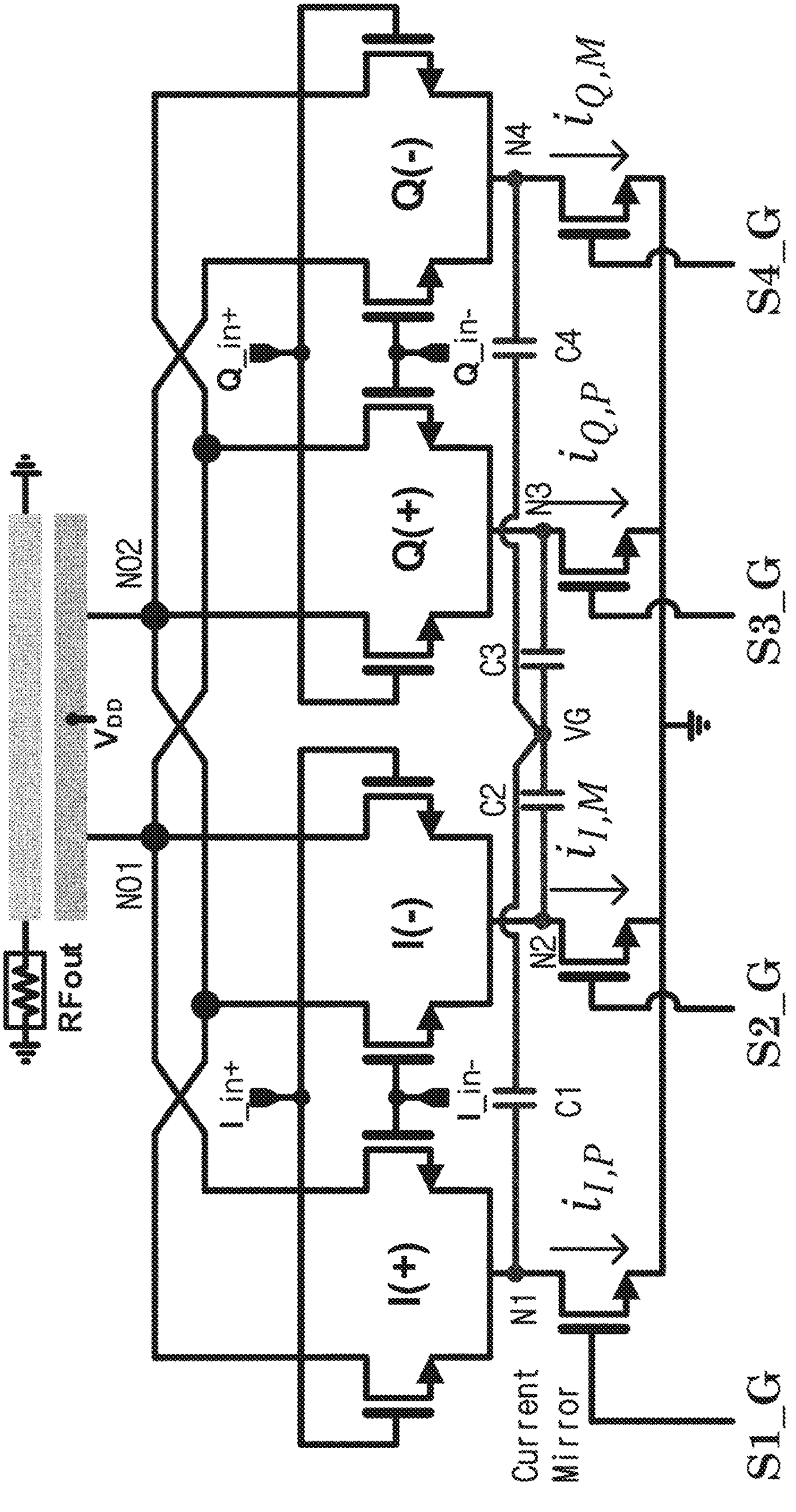
FIG. 5 is a diagram showing another example of a vector synthesizer including a harmonics cancellation circuit according to the present disclosure.

FIG. 5 is a diagram showing another example of a vector synthesizer including a harmonics cancellation circuit according to the present disclosure.

The example of FIG. 5 corresponds to a case in which a harmonics cancellation circuit according to the present disclosure is applied to a vector synthesizer in FIG. 2(*a*).

Figure 6:
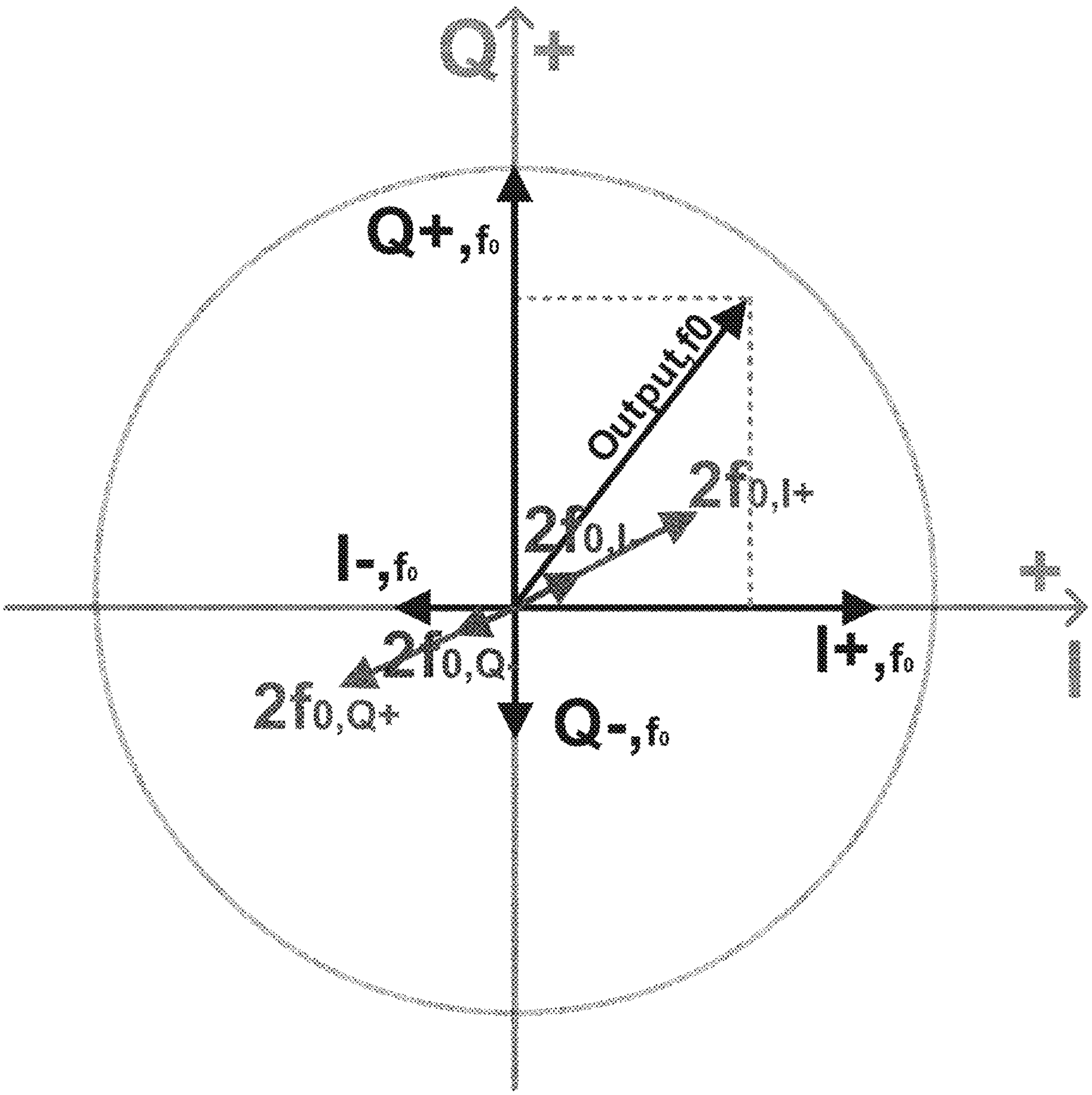
FIG. 6 is a diagram showing the harmonics cancellation characteristics of a harmonics cancellation circuit according to the present disclosure.

FIG. 6 is a diagram showing the harmonics cancellation characteristics of a harmonics cancellation circuit according to the present disclosure.

The example of FIG. 6 shows the second (2nd) harmonic cancellation characteristic when a harmonics cancellation circuit according to the present disclosure is applied to a vector synthesizer in a circuit including a DAC of FIG. 2(*c*). I+, I−, Q+, and Q− come in as an input signal with 0-degree, 90-degree, 180-degree and 270-degree phases, respectively, and when these input signals are amplified, the second harmonic components ($2f_{0,I+}$, $2f_{0,I-}$, $2f_{0,Q+}$, $2f_{0,Q-}$) appear in a circuit due to the nonlinearity of MOSFET. In theory, even-numbered harmonic components do not appear as an output in a perfect differential amplifier, but a mismatch necessarily occurs in an actual circuit and the second harmonics also appear in a source node, which affects circuit performance.

As in Table 1, it is assumed that the phase difference of a quadrature input signal corresponding to a fundamental frequency is 0, 90, 180 and 270 degrees. When a harmonics cancellation circuit according to the present disclosure is applied, a phase difference thereof becomes 0, 180, 360 and 180 degrees in the second harmonics, so when four nodes/vectors are combined into one, the overall second harmonic components may be reduced. In addition, a phase difference thereof become 0, 270, 180 and 90 degrees in the third harmonics, so when four nodes/vectors are combined into one, the overall third harmonic components may also be reduced.

TABLE 1

| Fundamental | Second Harmonics | Third Harmonics |
|---|---|---|
| 0 | 0 | 0 |
| 90 | 180 | 270 |
| 180 | 360 | 180 |
| 270 | 180 | 90 |

Figure 7:
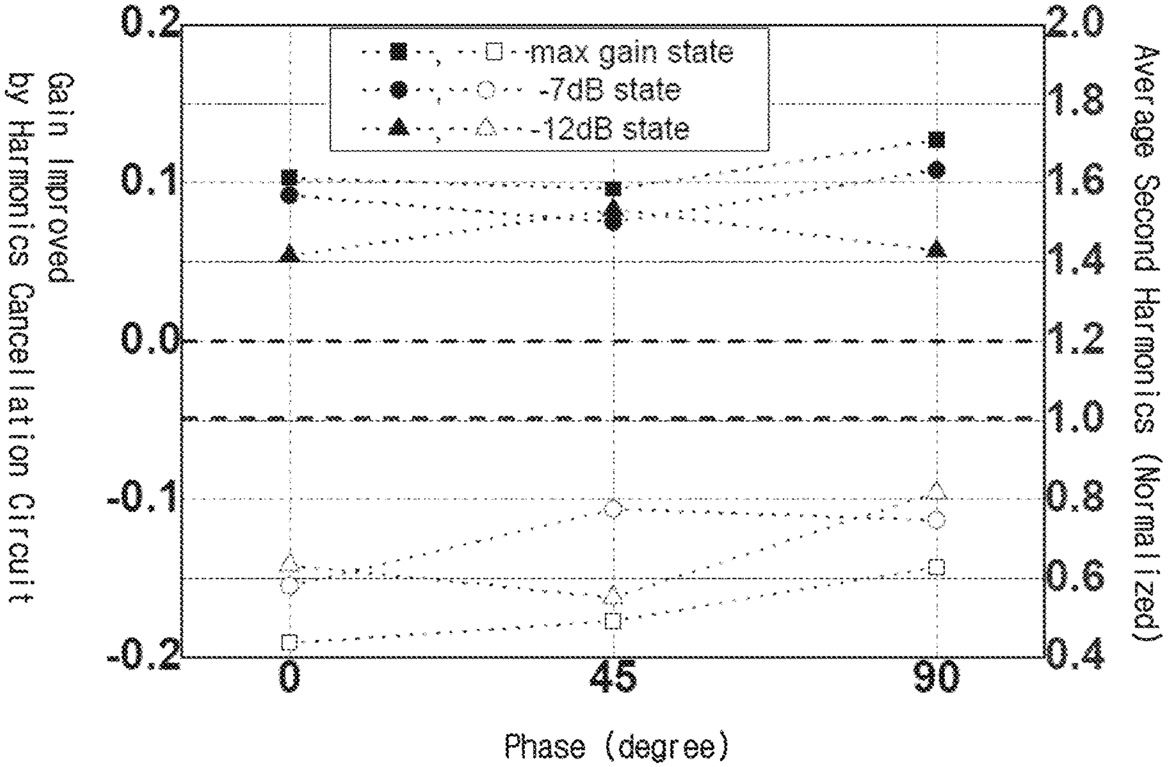
FIG. 7 is a diagram showing the simulation result of gain improvement according to the application of a harmonics cancellation circuit according to the present disclosure.

FIG. 7 is a diagram showing the simulation result of gain improvement according to the application of a harmonics cancellation circuit according to the present disclosure.

In the example of FIG. 7, the power gain improvement and the attenuation ratio of the second harmonic component attenuated through a harmonics cancellation circuit according to the present disclosure may be confirmed by phase angle.

As described above, in the present disclosure, by applying a harmonics cancellation circuit composed of four capacitances with a differentiated structure to a differential vector synthesizer including four pairs of amplifiers receiving a quadrature signal as an input, the harmonic components of a circuit may be effectively cancelled out, achieving the effects of linearity improvement and power gain improvement. In addition, a harmonics cancellation circuit according to the present disclosure may provide a new circuit structure that performs improvement by canceling out harmonic components without performance degradation for the vector synthesis of the existing vector synthesizer circuit.

A component described in illustrative embodiments of the present disclosure may be implemented by a hardware element. For example, the hardware element may include at least one of a digital signal processor (DSP), a processor, a controller, an application-specific integrated circuit (ASIC), a programmable logic element such as a FPGA, a GPU, other electronic device, or a combination thereof. At least some of functions or processes described in illustrative embodiments of the present disclosure may be implemented by software and software may be recorded in a recording medium. A component, a function and a process described in illustrative embodiments may be implemented by a combination of hardware and software.

A method according to an embodiment of the present disclosure may be implemented by a program which may be performed by a computer and the computer program may be recorded in a variety of recording media such as a magnetic Storage medium, an optical readout medium, a digital storage medium, etc.

A variety of technologies described in the present disclosure may be implemented by a digital electronic circuit, a computer hardware, a firmware, a software or a combination thereof. The technologies may be implemented by a computer program product, i.e., a computer program tangibly implemented on an information medium or a computer program processed by a computer program (e.g., a machine readable storage device (e.g.: a computer readable medium) or a data processing device) or a data processing device or implemented by a signal propagated to operate a data processing device (e.g., a programmable processor, a computer or a plurality of computers).

Computer program(s) may be written in any form of a programming language including a compiled language or an interpreted language and may be distributed in any form including a stand-alone program or module, a component, a subroutine, or other unit suitable for use in a computing environment. A computer program may be performed by one computer or a plurality of computers which are spread in one site or multiple sites and are interconnected by a communication network.

An example of a processor suitable for executing a computer program includes a general-purpose and special-purpose microprocessor and one or more processors of a digital computer. Generally, a processor receives an instruction and data in a read-only memory or a random access memory or both of them. A component of a computer may include at least one processor for executing an instruction and at least one memory device for storing an instruction and data. In addition, a computer may include one or more mass storage devices for storing data, e.g., a magnetic disk, a magnet-optical disk or an optical disk, or may be connected to the mass storage device to receive and/or transmit data. An example of an information medium suitable for implementing a computer program instruction and data includes a semiconductor memory device (e.g., a magnetic medium such as a hard disk, a floppy disk and a magnetic tape), an optical medium such as a compact disk read-only memory (CD-ROM), a digital video disk (DVD), etc., a magnet-optical medium such as a floptical disk, and a ROM (Read Only Memory), a RAM (Random Access Memory), a flash memory, an EPROM (Erasable Programmable ROM), an EEPROM (Electrically Erasable Programmable ROM) and other known computer readable medium. A processor and a memory may be complemented or integrated by a special-purpose logic circuit.

A processor may execute an operating system (OS) and one or more software applications executed in an OS. A processor device may also respond to software execution to access, store, manipulate, process and generate data. For simplicity, a processor device is described in the singular, but those skilled in the art may understand that a processor device may include a plurality of processing elements and/or various types of processing elements. For example, a processor device may include a plurality of processors or a processor and a controller. In addition, it may configure a different processing structure like parallel processors. In addition, a computer readable medium means all media which may be accessed by a computer and may include both a computer storage medium and a transmission medium.

The present disclosure includes detailed description of various detailed implementation examples, but it should be understood that those details do not limit a scope of claims or an invention proposed in the present disclosure and they describe features of a specific illustrative embodiment.

Features which are individually described in illustrative embodiments of the present disclosure may be implemented by a single illustrative embodiment. Conversely, a variety of features described regarding a single illustrative embodiment in the present disclosure may be implemented by a combination or a proper sub-combination of a plurality of illustrative embodiments. Further, in the present disclosure, the features may be operated by a specific combination and may be described as the combination is initially claimed, but in some cases, one or more features may be excluded from a claimed combination or a claimed combination may be changed in a form of a sub-combination or a modified sub-combination.

Likewise, although an operation is described in specific order in a drawing, it should not be understood that it is necessary to execute operations in specific turn or order or it is necessary to perform all operations in order to achieve a desired result. In a specific case, multitasking and parallel processing may be useful. In addition, it should not be understood that a variety of device components should be separated in illustrative embodiments of all embodiments and the above-described program component and device may be packaged into a single software product or multiple software products.

Illustrative embodiments disclosed herein are just illustrative and do not limit a scope of the present disclosure. Those skilled in the art may recognize that illustrative embodiments may be variously modified without departing from a claim and a spirit and a scope of its equivalent.

Accordingly, the present disclosure includes all other replacements, modifications and changes belonging to the following claim.

The invention claimed is:

1. A radio frequency integrated circuit, the circuit comprising:

a quadrature phase signal generator that outputs a plurality of quadrature phase signals corresponding to a differential input signal;

a plurality of amplifiers that amplify the plurality of quadrature phase signals, respectively;

a plurality of current controllers that control a tail current of a source node of the plurality of amplifiers, respectively;

a synthesizer that synthesizes a plurality of amplified quadrature phase signals to output an output signal; and at least one digital to analog converter (DAC) that controls a phase and a gain of the output signal, wherein one end of a plurality of capacitors is connected to the source node of the plurality of amplifiers, respectively, and another end of each of the plurality of capacitors is commonly connected to a virtual ground.

2. The circuit of claim 1, wherein:

the at least one DAC includes at least one of a gain control DAC, a first phase control DAC, or a second phase control DAC.

3. The circuit of claim 1, wherein:

a first amplifier among the plurality of amplifiers includes a first transistor and a second transistor that amplify a first quadrature phase signal (I+) among the plurality of quadrature phase signals, a source node of the first amplifier is connected to a source node of the first transistor, a source node of the second transistor, and a drain of a first current controller among the plurality of current controllers, one end of a first capacitor among the plurality of capacitors is connected to the source node of the first amplifier, and another end of the first capacitor is connected to the virtual ground.

4. The circuit of claim 1, wherein:

a second amplifier among the plurality of amplifiers includes a third transistor and a fourth transistor that amplify a second quadrature phase signal (I−) among the plurality of quadrature phase signals, a source node of the second amplifier is connected to a source node of the third transistor, a source node of the fourth transistor, and a drain of a second current controller among the plurality of current controllers, one end of a second capacitor among the plurality of capacitors is connected to the source node of the second amplifier, and another end of the second capacitor is connected to the virtual ground.

5. The circuit of claim 1, wherein:

a third amplifier among the plurality of amplifiers includes a fifth transistor and a sixth transistor that amplify a third quadrature phase signal (Q+) among the plurality of quadrature phase signals, a source node of the third amplifier is connected to a source node of the fifth transistor, a source node of the sixth transistor, and a drain of a third current controller among the plurality of current controllers, one end of a third capacitor among the plurality of capacitors is connected to the source node of the third amplifier, and another end of the third capacitor is connected to the virtual ground.

6. The circuit of claim 1, wherein:

a fourth amplifier among the plurality of amplifiers includes a seventh transistor and an eighth transistor that amplify a fourth quadrature phase signal (Q−) among the plurality of quadrature phase signals, a source node of the fourth amplifier is connected to a source node of the seventh transistor, a source node of the eighth transistor, and a drain of a fourth current controller among the plurality of current controllers, one end of a fourth capacitor among the plurality of capacitors is connected to the source node of the fourth amplifier, and another end of the fourth capacitor is connected to the virtual ground.

* * * * *